United States Patent
Shin et al.

(10) Patent No.: US 9,985,059 B2
(45) Date of Patent: May 29, 2018

(54) IMAGE SENSORS HAVING CURVED UPPER SURFACES AND IMAGE SENSOR MODULES INCLUDING THE SAME

(71) Applicant: SK hynix Inc., Gyeonggi-do (KR)

(72) Inventors: Hyun-Gyu Shin, Gyeonggi-do (KR); Sang-Sik Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 52 days.

(21) Appl. No.: 15/206,800

(22) Filed: Jul. 11, 2016

(65) Prior Publication Data
US 2017/0301710 A1    Oct. 19, 2017

(30) Foreign Application Priority Data
Apr. 15, 2016  (KR) .......................... 10-2016-0046221

(51) Int. Cl.
*H01L 27/00*  (2006.01)
*H01L 27/146*  (2006.01)
*H04N 5/225*  (2006.01)

(52) U.S. Cl.
CPC ..... *H01L 27/14605* (2013.01); *H04N 5/2253* (2013.01)

(58) Field of Classification Search
CPC ........... H01L 31/0203; H01L 27/14601; H01L 27/14683; H01L 27/14687; H01L 27/1469
See application file for complete search history.

(56) References Cited

U.S. PATENT DOCUMENTS 9,099,604 B2    8/2015  Roy et al.
2001/0020671 A1*  9/2001  Ansorge ............ H01L 27/14603
                                                        250/208.1

* cited by examiner

*Primary Examiner* — Thanh Luu
(74) *Attorney, Agent, or Firm* — IP & T Group LLP

(57) ABSTRACT

Provided is an image sensor. The image sensor may include a circuit board, a supporting board provided under the circuit board, and an image sensor chip provided over the circuit board. The circuit board, the supporting board, and the image sensor chip respectively have concavely curved upper surfaces. The supporting board comprises a central area and a peripheral area. The central area is thinner than the peripheral area.

19 Claims, 18 Drawing Sheets

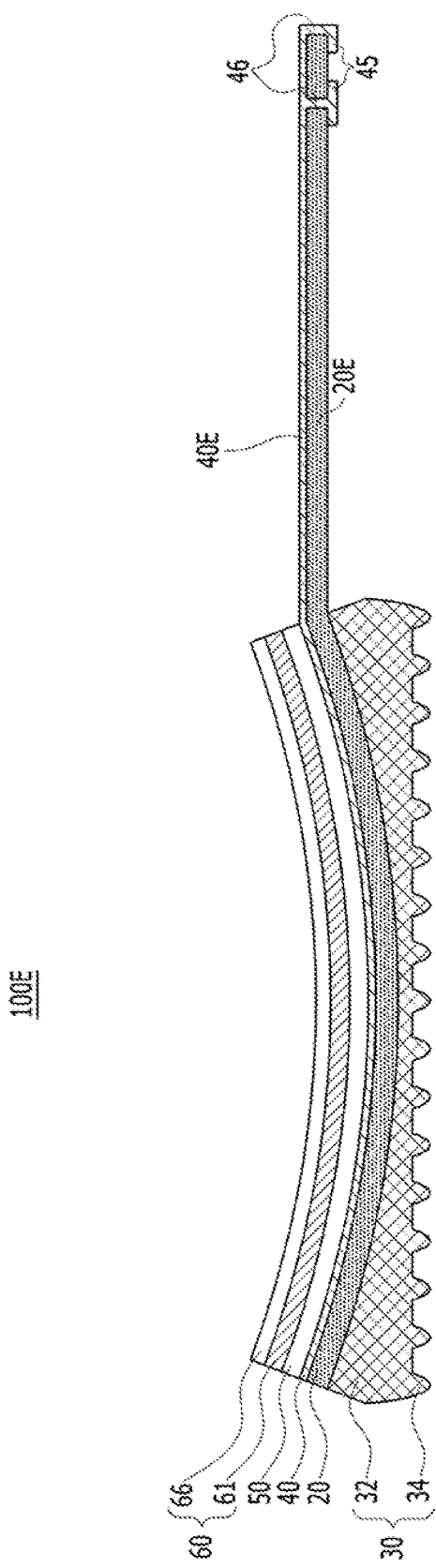

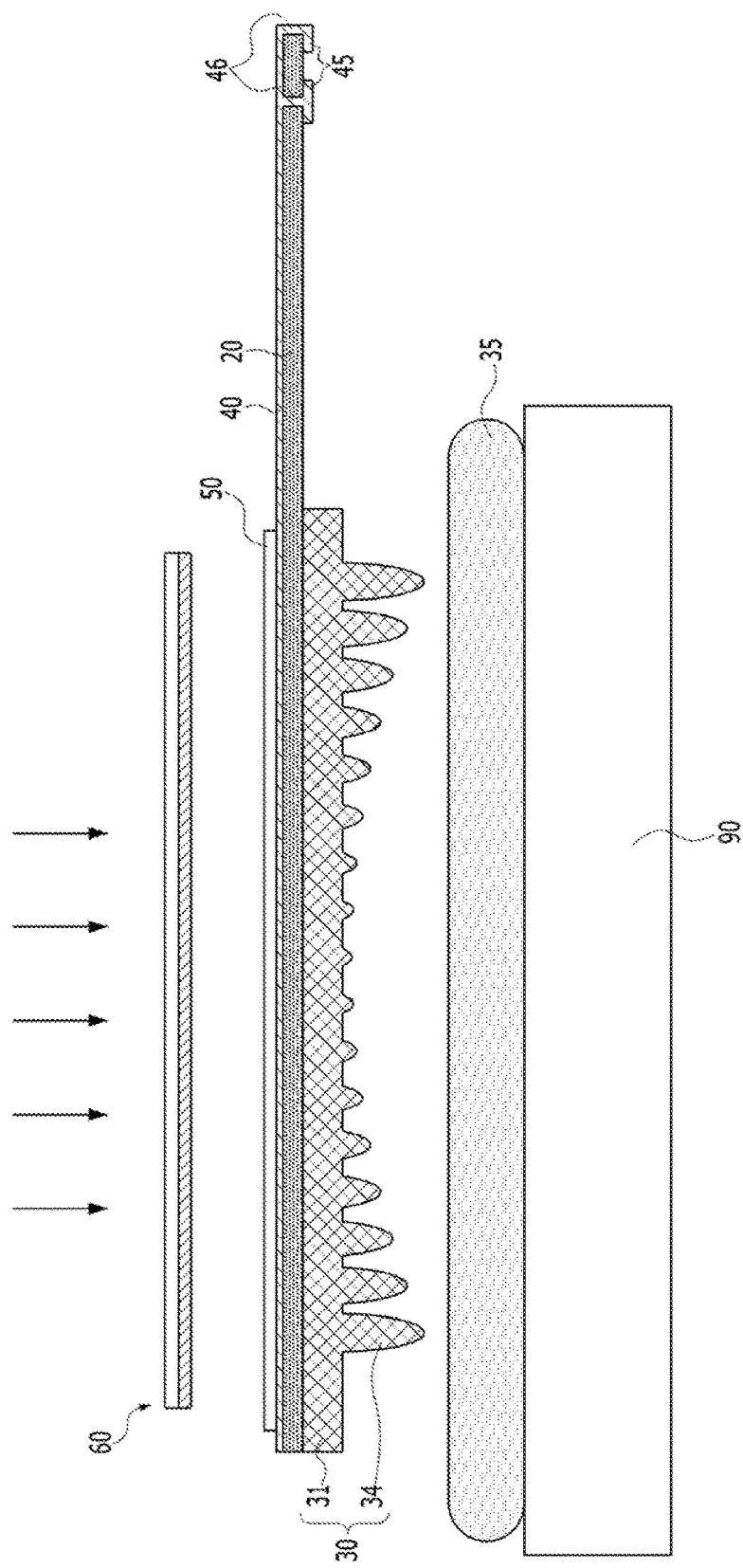

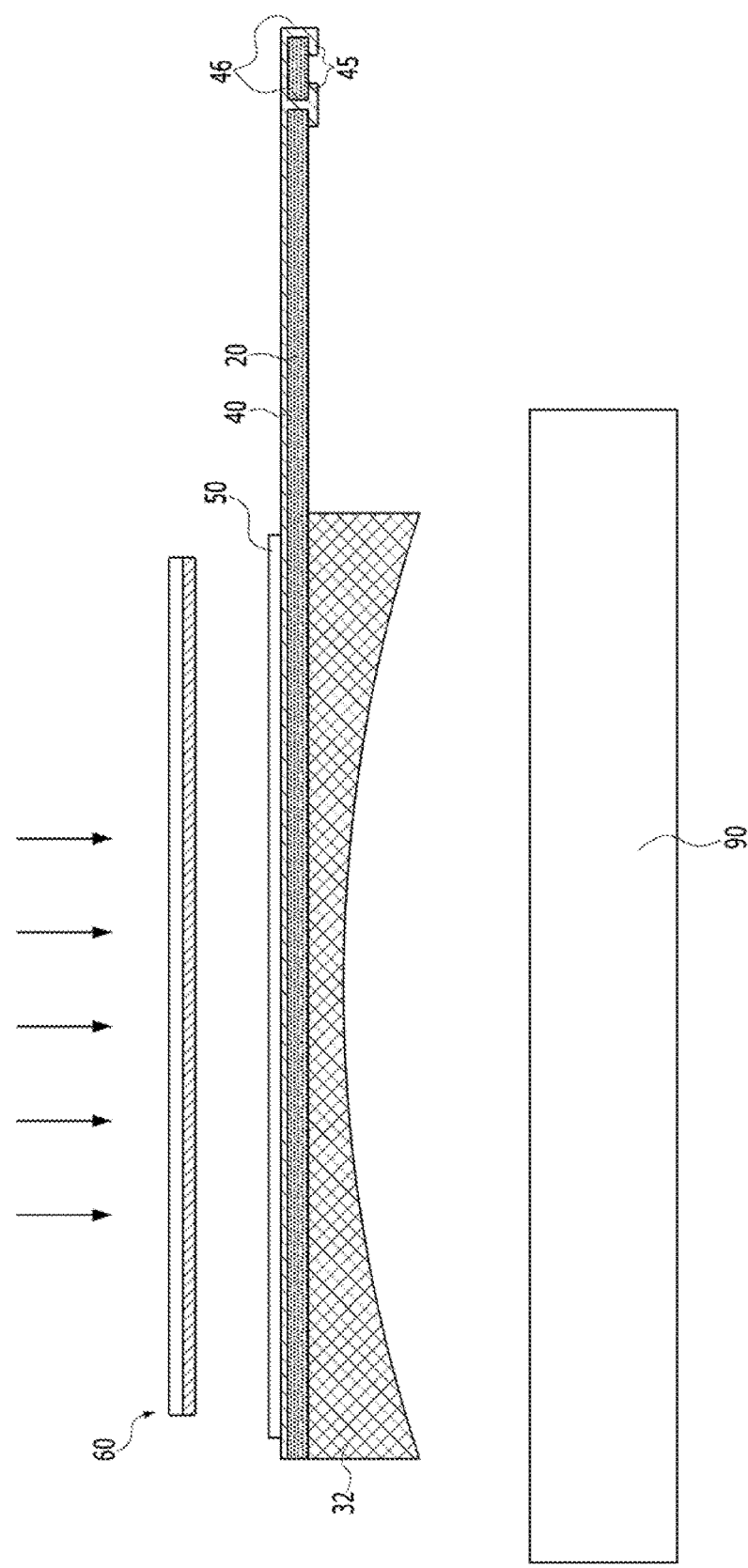

IMAGE SENSORS HAVING CURVED UPPER SURFACES AND IMAGE SENSOR MODULES INCLUDING THE SAME

CROSS-REFERENCE TO RELATED APPLICATION

The present application claims priority to Korean Patent Application No. 10-2016-0046221, filed on Apr. 15, 2016, which is herein incorporated by reference in its entirety.

BACKGROUND

1. Field

Exemplary embodiments of the inventive concepts relate to image sensors having curved upper surfaces and image sensor modules including the image sensors.

2. Description of the Related Art

In an imaging system, such as an image sensor module, a camera lens having a spherical surface is disposed on the light-receiving surface side of an image sensor. The pixels of the image sensor receive different amounts of light depending on location due to the spherical aberration of the camera lens. For example, the pixels in a central area and the pixels in a peripheral area may have different photoelectric conversion capabilities due to different focuses and/or different amounts of incident light. To address such issues, an image sensor having a concavely curved upper surface is proposed so that the light-receiving surface of the image sensor corresponds to the curved surface of a camera lens.

SUMMARY

Exemplary embodiments of the inventive concepts provide image sensors having curved upper surfaces and image sensor modules including the image sensors.

Exemplary embodiments of the inventive concepts provide methods of fabricating image sensors having curved upper surfaces and image sensor modules having the image sensors.

The technical objectives of the inventive concepts are not limited to the above disclosure, and those skilled in the art to which the inventive concepts may evidently understand other objectives from the following descriptions.

In accordance with an embodiment of the inventive concepts, an image sensor may include a circuit board, a supporting board provided under the circuit board, and an image sensor chip provided over the circuit board. The circuit board, the supporting board, and the image sensor chip respectively have concavely curved upper surfaces. The supporting board comprises a central area and a peripheral area. The central area is thinner than the peripheral area.

The circuit board may include a flexible printed circuit board.

The supporting board may include a thermosetting material.

The supporting board may include a supporting plate having the concavely curved upper surface, and a plurality of supporting members provided under the board plate.

Each of the plurality of supporting members may have a bump shape downwardly protruding from a bottom surface of the supporting plate.

The plurality of supporting members may include first supporting members located in the central area and second supporting members located in the peripheral area. The first supporting members may be smaller in size than the second supporting members.

The supporting plate and the plurality of supporting members may be formed of the same material.

The plurality of supporting members may be spaced apart from each other. The image sensor may further include a fixing material which is provided under the board plate and between the plurality of supporting members.

The fixing material may have a thermosetting material.

The image sensor may further include a board wiring layer and an adhesive layer which are provided between the circuit board and the image sensor chip, and a chip connector electrically connecting the circuit board to the board wiring layer together.

In accordance with an embodiment of the inventive concepts, an image sensor may include a circuit board, a supporting board provided under the circuit board, a board wiring layer provided over the circuit board, and an image sensor chip provided over the board wiring layer. The supporting board may include a supporting plate and a plurality of supporting members. The supporting plate may include a concavely curved upper surface. The plurality of supporting members may be provided under the supporting plate.

Each of the plurality of supporting members may have a pillar shape.

The plurality of supporting members may include first supporting members and second supporting members. The first supporting members may be located under a central area of the supporting plate. The second supporting members may be located under a peripheral area of the supporting plate. The first supporting members may be shorter in length than the second supporting members.

The supporting members may be not disposed in a central area of the supporting plate and may be disposed in a peripheral area of the supporting plate.

Bottom surfaces of the plurality of supporting members may be arranged horizontally flat.

The circuit board, the supporting plate, and the board wiring layer may include first, second, and third central areas and first, second, and third peripheral areas, respectively. Upper surfaces of the first, the second, and the third central areas may be concavely curved. Upper surfaces of the first, the second, and the third peripheral areas may be flat.

The image sensor chip may include a pixel array and circuit array. The pixel array may be provided over the third center area of the circuit board. The circuit array may be provided over the third peripheral area of the circuit board. The first, the second, and the third central areas of the circuit board, the supporting plate of the supporting board, and the board wiring layer may vertically overlap the pixel array of the image sensor chip.

In accordance with an embodiment of the inventive concepts, an image sensor may include a flexible circuit board, a rigid supporting board provided under the flexible circuit board, a board wiring layer provided over the flexible circuit board, and an image sensor chip provided over the board wiring layer. The circuit board, the supporting board, the board wiring layer, and the image sensor chip may include first areas and second areas, respectively. Each of the second areas may be located in a periphery of each of the first areas. Each of the first areas may have a concavely curved upper surface. Each of the second areas may have a flat upper surface. The first area of the supporting board may have a concave-convex bottom surface.

The supporting board may include a supporting plate including a third area and a fourth area, and supporting members provided under the third area of the supporting plate. An upper surface of the supporting plate in the third area may form the concavely curved upper surface of the supporting board, and the supporting members in the fourth area, in combination, may form the concave-convex bottom surface of the supporting board.

The supporting members may be spaced apart from each other. The image sensor may further include a fixing member which may be disposed under the third area of the supporting plate and between the supporting members.

The details of other embodiments are included in the detailed description and the drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 3A to 3E are sectional views of image sensor modules in accordance with various embodiments of the inventive concepts.

FIGS. 5A to 7B are sectional views illustrating methods for fabricating image sensors or image sensor modules in accordance with various embodiments of the inventive concepts.

DETAILED DESCRIPTION

Figure 1:
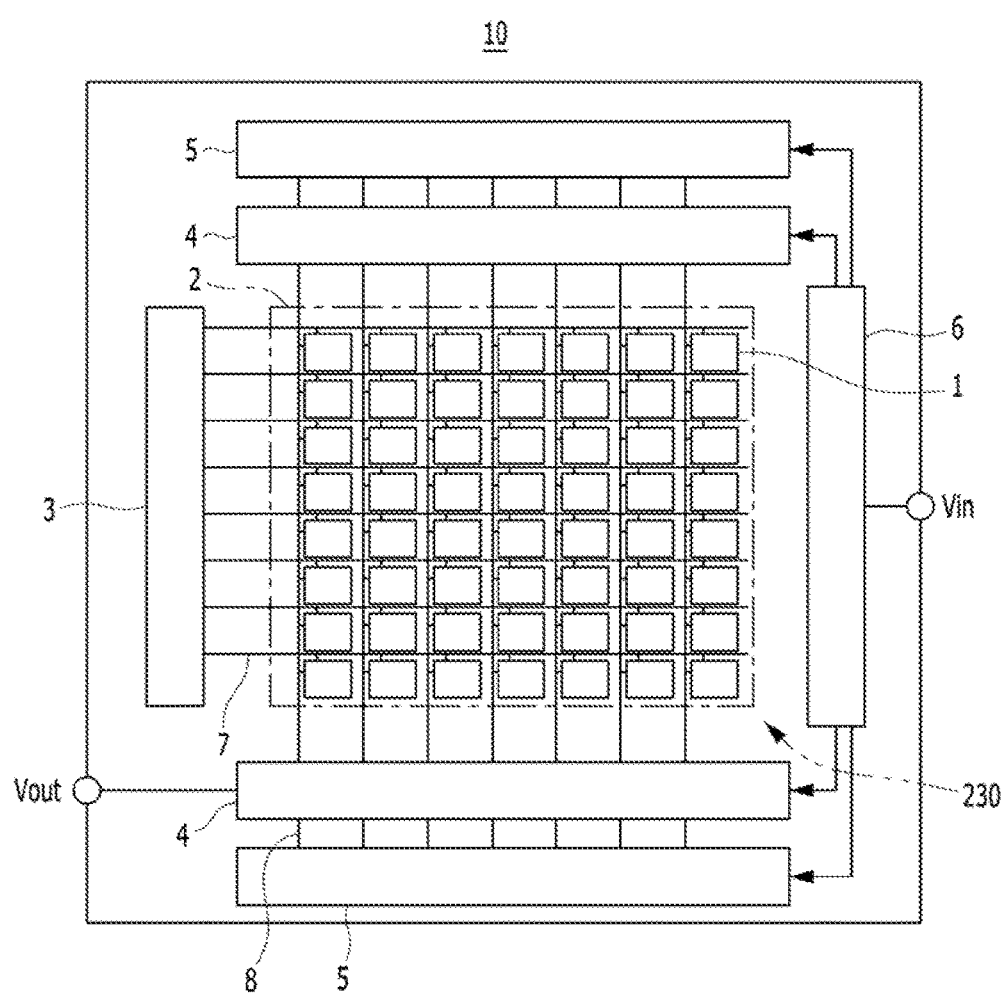
FIG. 1 is a block diagram schematically illustrating an image sensor in accordance with an embodiment of the inventive concepts.

Various embodiments will be described below in more detail with reference to the accompanying drawings. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. Throughout the disclosure, like reference numerals refer to like parts throughout the various figures and embodiments of the inventive concepts.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

The merits and characteristics of the inventive concepts and methods for achieving the merits and characteristics will become evident from embodiments described in detail later in conjunction with the accompanying drawings. However, the inventive concepts are not limited to the disclosed embodiments, but may be implemented in various different ways. The embodiments are provided to only complete the disclosure of the inventive concepts and to allow a person having ordinary skill in the art to which the inventive concepts pertain to completely understand the invention which is defined by the claims.

Terms used in the specification are provided to describe the embodiments and are not intended to limit the inventive concepts. In the specification, the singular form, unless specially described otherwise, may include the plural form. Furthermore, terms, such as "comprises" and/or "comprising" used in the specification, do not exclude the existence or addition of one or more elements, steps, operations and/or devices in the described elements, steps, operations and/or devices.

When it is described that one element is "connected to" or "coupled" to" the other element, it means that the one element may be directly connected to or coupled to the other element or a third element may be interposed between the two elements. In contrast, when it is described that one element is "directly connected to" or "directly coupled" to" the other element, it means that a third element is not interposed between the two elements. The term "and/or" includes a combination of respective described items and all combinations of one or more of the items.

Spatially relative terms, such as "below", "beneath", "lower", "above", and "upper", may be used to describe the correlations between one element or elements and the other element or other elements as illustrated in the drawings. The spatially relative terms should be understood as encompassing different directions of an element in use or operation in addition to the direction depicted in the drawing. For example, if the element in the drawing is turned over, one element described as being "below" or "beneath" the other element would then be placed "above" the other element.

Furthermore, the embodiments described in this specification may be described with reference to cross-sectional views and/or plane views, that is, ideal exemplary diagrams of the inventive concepts. In the drawings, the thickness of films and areas has been enlarged to effectively describe technical contents. Accordingly, forms of the exemplary diagrams may be changed by a manufacturing technology and/or tolerance. Accordingly, the embodiments of the inventive concepts are limited to the illustrated specific forms, but may include a change in a form generated according to a manufacturing process. For example, an area illustrated as being at a right angle may be in a rounded form or in a form having a specific curvature. Accordingly, areas illustrated in the drawings have approximate attributes, and the forms of the illustrated areas are provided to illustrate specific forms of the areas of a device and are not intended to limit the scope of the invention.

Throughout the specification, the same reference numerals denote the same elements. Accordingly, the same reference numerals or similar reference numerals may be described with reference to other drawings although they are mentioned or described in corresponding drawings. Furthermore, although reference numerals are not shown, the reference numerals may be described with reference to other drawings.

FIG. 1 is a block diagram schematically illustrating an image sensor 10 in accordance with an embodiment of the inventive concepts. Referring to FIG. 1, the image sensor 10 in accordance with an embodiment of the inventive concepts may include a pixel array 2 including a plurality of unit pixels 1 arranged in a matrix form, a row driving circuit 3, a column signal processor 4, a column driving circuit 5, and a system control circuit 6.

A plurality of pixels may include a plurality of the unit pixels 1, respectively. The plurality of unit pixels 1 may include red pixels, green pixels, and blue pixels or may include magenta pixels, cyan pixels, and yellow pixels. The plurality of unit pixels 1 may include a plurality of photodiodes, color filters, and microlenses vertically aligned with one another, respectively.

The row driving circuit 3 may sequentially drive the plurality of unit pixels 1 within the pixel array 2 for each unit. The plurality of driven unit pixels 1 may provide the column signal processor 4 with charges corresponding to the amount of light which the plurality of driven unit pixels 1 received. The column signal processor 4 may include a correlated double sampler (CDS), a sensor amplifying (SA) circuit, and an analogue/digital convertor (ADC). The column signal processor 4 may perform sensing, amplification, noise elimination, and conversion on a received electrical signal and provide a digital signal to the column driving circuit 5.

The column driving circuit 5 may receive digital signals from the respective column lines of the column signal processor 4 and buffer, latch, and output the received digital signals. In some embodiments of the inventive concepts, the column driving circuit 5 may perform dark level control and row/column deviation correction and may further process other various digital signals. The system control circuit 6 may transmit a clock signal and a command signal to the row driving circuit 3, the column signal processor 4, and the column driving circuit 5, and may control data output.

FIGS. 2A to 2E are sectional views of image sensors 10A-10E in accordance with exemplary embodiments of the inventive concepts. For example, FIGS. 2A to 2E are sectional views of the image sensor 10 shown in FIG. 1.

Figure 2A:
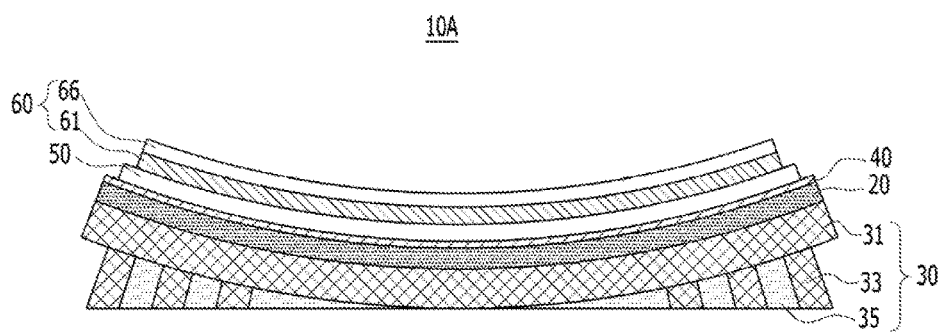
FIGS. 2A to 2E are sectional views of image sensors in accordance with various embodiments of the inventive concepts.

Referring to FIG. 2A, the image sensor 10A in accordance with an embodiment of the inventive concepts may include a circuit board 20, a supporting board 30 beneath the circuit board 20, a board wiring layer 40 on the circuit board 20, an adhesive layer 50 over the board wiring layer 40, and an image sensor chip 60 on the adhesive layer 50.

The circuit board 20 may be flexible. For example, the circuit board 20 may include a flexible printed circuit board (FPCB). The supporting board 30 may include a rigid supporting plate 31 having a concavely curved upper surface, a plurality of rigid supporting members 33 beneath the supporting plate 3, and a rigid fixing member 35 between the supporting members 33.

The supporting plate 31 may include a thermoplastic resin or a thermosetting resin. For example, the supporting plate 31 may include at least one of thermoplastic resins or thermosetting resins, such as polyethylene, polyvinyl chloride, polypropylene, polystyrene, polyacrylonitrile, styrene-acrylonitrile copolymer, acrylonitrile-butadiene-styrene, polymethyl methacrylate, polytetrafluoroethylene (teflon), polychlorotrifluoroethylene, polyamides, polyphthalamide, polycarbonate, phenylene oxide-based resin, acetal, thermoplastic polyester, polysulfone, polyphenylene sulfide, polyetherimide, plastic, paper phenolithic, epoxy resin epoxy resin, paper epoxy, polyimide, bismaleimide/triazine (B.T.), or inorganic materials, such as ceramics, silicon, or glass. In some embodiments of the inventive concepts, the supporting plate 31 may include the same material as the circuit board 20.

The plurality of supporting members 33 may have downwardly protruding shapes from a bottom surface of the supporting plate 31. The plurality of supporting members 33 may be spaced apart from each other.

Specifically, the closer to the central area of the supporting plate 31, the supporting members 33 are located, the shorter the lengths of the supporting members 33 are, the narrower the widths of the supporting members 33 are, or the smaller the volumes of the supporting members 33 are. Furthermore, as the supporting members 33 become closer to the peripheral area of the supporting plate 31, the lengths of the supporting members 33 may become relatively longer, the widths of the supporting members 33 may become relatively wider, or the volumes of the supporting members 33 may become relatively greater.

For example, the bottom surfaces of the supporting plate 31 and the supporting members 33 may have concave-convex shapes or embossing shapes. The supporting members 33 may have slanted pillar shapes inclined from the center of the supporting members 33 to the periphery thereof. The supporting members 33 may not be formed at the bottom of the central area of the supporting plate 31. For example, the supporting members 33 may not be disposed in the central area of the supporting plate 31, but may be disposed only in the peripheral area of the supporting plate 31.

The supporting members 33 may include the same material as the supporting plate 31. For example, the supporting members 33 and the supporting plate 31 may be formed of a single body. In some embodiments of the inventive concepts, the supporting members 33 may have cylindrical or polygonal pillar shapes.

The fixing member 35 may be filled between the supporting members 33 and may firmly hold the supporting members 33. The fixing member 35 may include a thermosetting resin, such as epoxy resin.

Bottom surfaces of the supporting members 33 may be arranged horizontally flat. In addition, bottom surfaces of the supporting members 33 and bottom surfaces of the fixing members 35 may be arranged substantially horizontally flat. Furthermore, central bottom end of the supporting plate 31 and bottom ends of the supporting members 33 may be substantially horizontally aligned.

The board wiring layer 40 may include metal, such as copper (Cu). The board wiring layer 40 may include a plurality of metal lines and metal pads.

The adhesive layer 50 may include a die adhesive film (DAF) having for example, epoxy resin, acryl resin and/or polyolefin. In some embodiments of the inventive concepts, the adhesive layer 50 may include an under-fill material or a thermal interface material (TIM).

The image sensor chip 60 may include a chip substrate 61 and a sensing unit 66 on the chip substrate 61. The chip substrate 61 may include a silicon wafer or an epitaxial growth layer. The sensing unit 66 may include a plurality of color filters and a plurality of microlenses. In some embodiments of the inventive concepts, the chip substrate 61 may include a handling substrate, and the sensing unit 66 may include a device substrate. For example, the chip substrate 61 may include metal wires, and the sensing unit 66 may include a plurality of photodiodes.

The circuit board 20, the supporting plate 31 of the supporting board 30, the board wiring layer 40, the adhesive layer 50, and the image sensor chip 60 of the image sensor 10A in accordance with exemplary embodiments of the inventive concepts may have concavely curved upper surfaces.

Figure 2B:
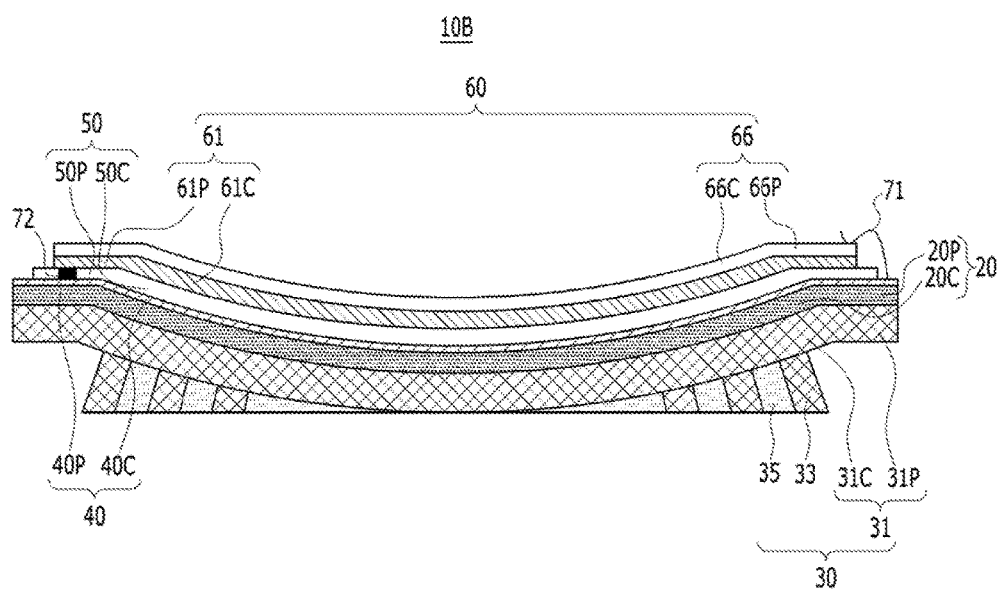

Referring to FIG. 2B, the image sensor 10B in accordance with an exemplary embodiment of the inventive concepts may include a central area having a concavely curved top surface and a peripheral area having a flat top surface. For example, the circuit board 20, the supporting plate 31 of the supporting board 30, the board wiring layer 40, the adhesive layer 50, and the chip substrate 61 and sensing unit 66 of the image sensor chip 60 may include concavely curved central areas 20C, 31C, 40C, 50C, 61C, and 66C and flat peripheral areas 20P, 31P, 40P, 50P, 61P, and 66P, respectively. The central areas 20C, 31C, 40C, and 50C of the circuit board 20, the supporting plate 31 of the supporting board 30, the board wiring layer 40, and the adhesive layer 50 may be a chip mount area on which the image sensor chip 60 is mounted.

The image sensor 10B may further include a chip connector 71, 72 to electrically connect the image sensor chip 60 to the board wiring layer 40. For example, the chip connector 71, 72 may include one of bonding wires 71 or chip via plugs 72. The chip via plug 72 may pass through the adhesive layer 50.

Further referring to FIG. 2B, the concaved central areas 61C and 66C of the image sensor chip 60 may substantially include the pixel array 2 shown in FIG. 1. The flat peripheral areas 61P and 66P of the image sensor chip 60 may substantially include the row driving circuit 3, the column signal processor 4, the column driving circuit 5, and the system control circuit 6 shown in FIG. 1. Accordingly, the concavely curved central areas 20C, 31C, 40C, and 50C of the circuit board 20, the supporting plate 31 of the supporting board 30, the board wiring layer 40, and the adhesive layer 50 may be vertically aligned with the pixel array 2 of the image sensor 10 shown in FIG. 1. The flat peripheral areas 20P, 31P, 40P, and 50P of the circuit board 20, the supporting plate 31 of the supporting board 30, the board wiring layer 40, and the adhesive layer 50 may be vertically aligned with the row driving circuit 3, column signal processor 4, column driving circuit 5, and system control circuit 6 of the image sensor 10 shown in FIG. 1.

Figure 2C:
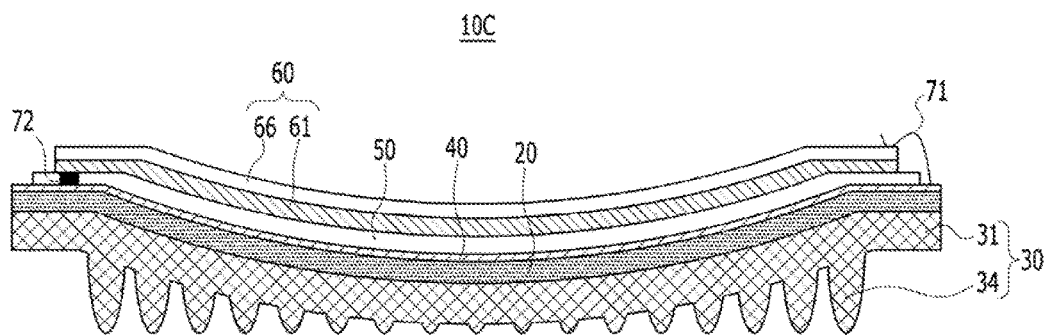

Referring to FIG. 2C, the image sensor 10C in accordance with an exemplary embodiment of the inventive concepts includes the circuit board 20, the supporting board 30, the board wiring layer 40, the adhesive layer 50, and the image sensor chip 60. The supporting board 30 may include a supporting plate 31 having an upper surface concavely curved and supporting members 34 having bump shapes. The supporting members 34 are provided beneath the supporting plate 31. The supporting members 34 located in a central area of the supporting plate 31 may be relatively shorter, thinner, or smaller in size than the supporting members 34 located in a peripheral area of the supporting plate 31. The supporting members 34 located in the peripheral area may be relatively longer, thicker, or greater in size than the supporting members 34 located in the central area of the supporting plate 31.

The supporting members 34 of the bump shapes may protrude from the bottom surface of the supporting plate 31. For example, the bottom surfaces of the supporting plate 31 and the supporting members 34 may have a concave-convex shape or an embossing shape. The supporting members 34 of the bump shapes may protrude less as the supporting members 34 become closer to the central area of the supporting plate 31, and may protrude relatively farther as the supporting members 34 become closer to the peripheral area of the supporting plate 31.

For example, as the supporting members 34 become close to the central area of the supporting plate 31, the lengths of the supporting members 34 may be relatively shorter, the widths of the supporting members 34 may be relatively narrower, or the volumes of the supporting members 34 may be relatively smaller. Furthermore, as the supporting members 34 become close to the peripheral area of the supporting plate 31, the lengths of the supporting members 34 may be relatively longer, the widths of the supporting members 34 may be relatively wider, or the volumes of the supporting members 34 may be relatively greater.

The end portions of the supporting members 34 of the bump shapes may be rounded. The supporting plate 31 and the supporting members 34 may include the same material so that the supporting plate 31 and the supporting members 34 form a single body. The supporting members 34 of the bump shapes may not be formed in the central area of the supporting plate 31.

Figure 2D:
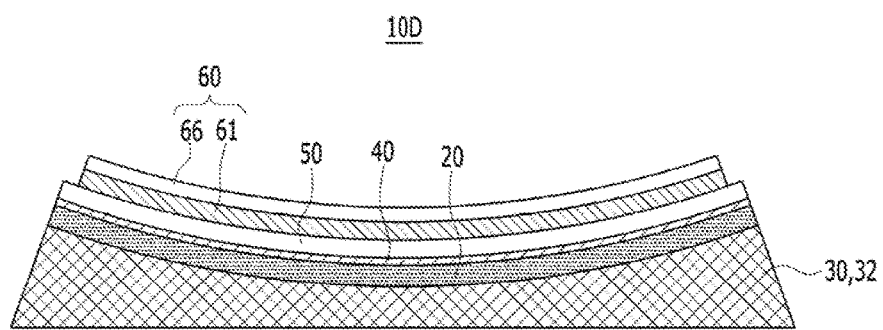

Referring to FIG. 2D, the image sensor 10D in accordance with an exemplary embodiment of the inventive concepts includes the circuit board 20, the supporting board 30 or a supporting plate 32, the board wiring layer 40, the adhesive layer 50, and the image sensor chip 60. The supporting board 30 or the supporting plate 32 may have a relatively thin central area and a relatively thick peripheral area. For example, the upper surface of the supporting board 30 or the supporting plate 32 may be concavely curved, and the bottom surface thereof may be substantially flat.

Figure 2E:
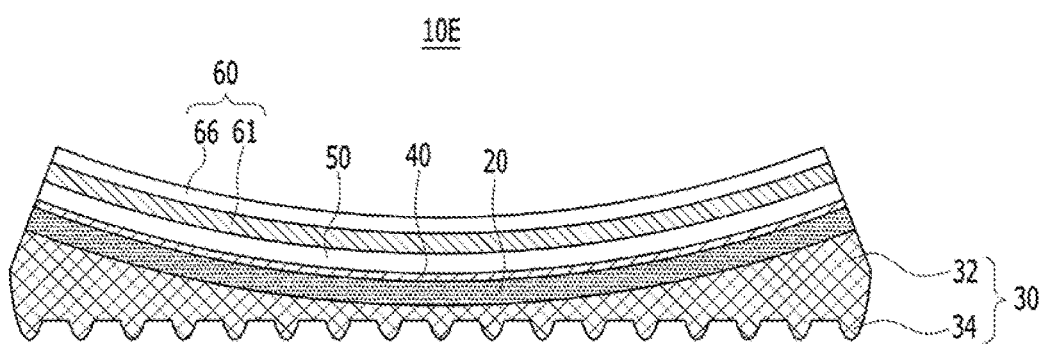
Figure 3A:
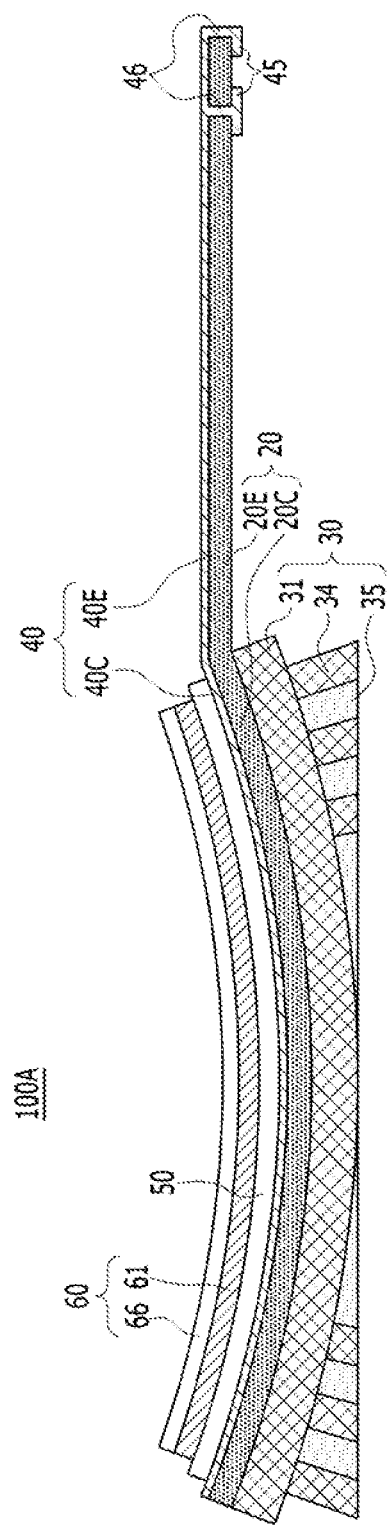
Figure 3B:
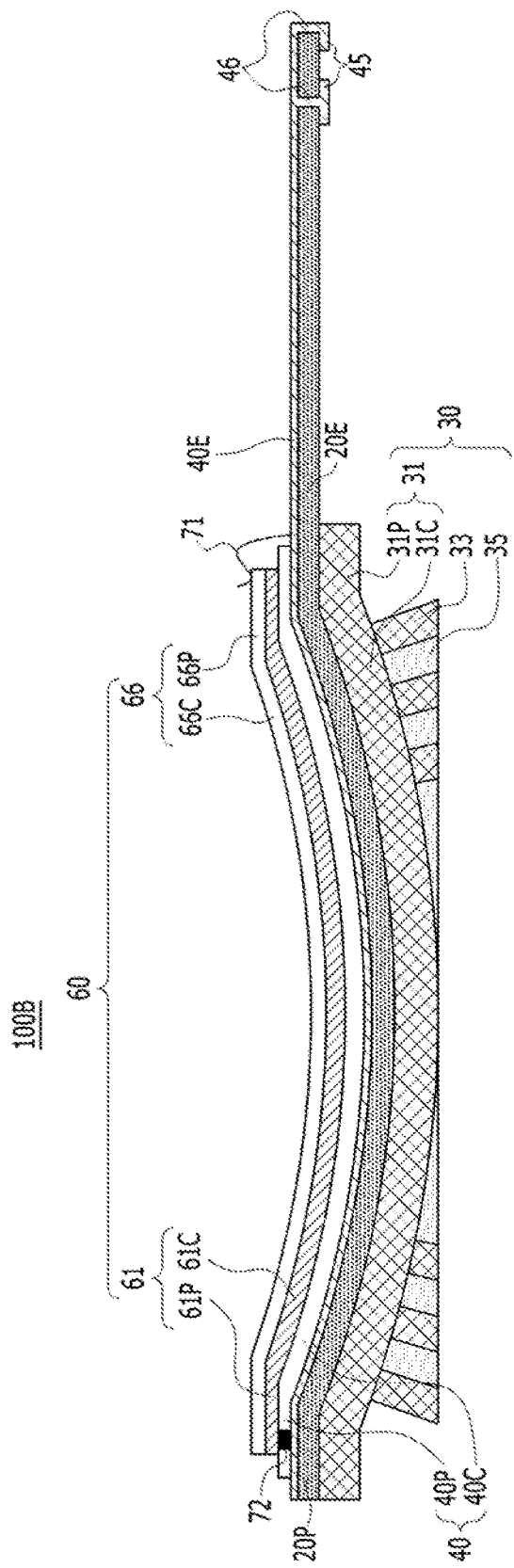
Figure 3C:
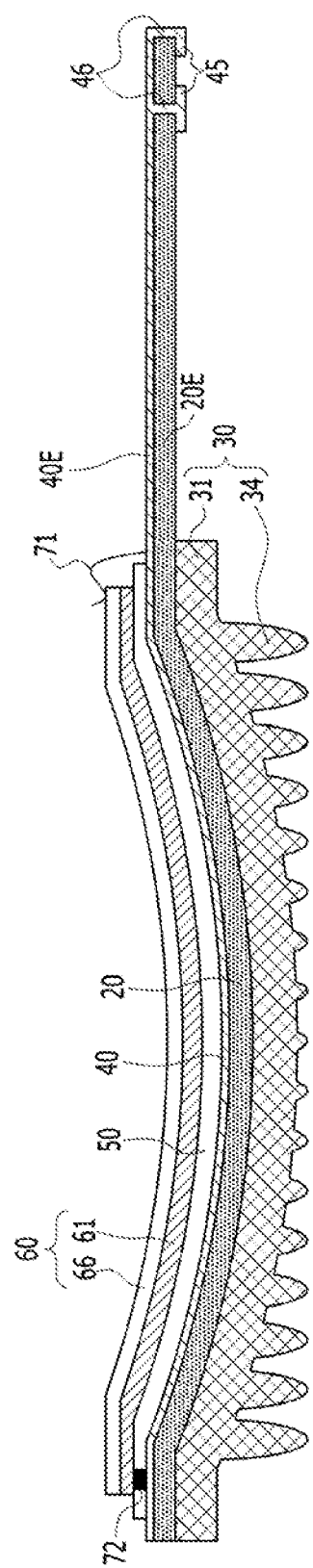
Figure 3D:
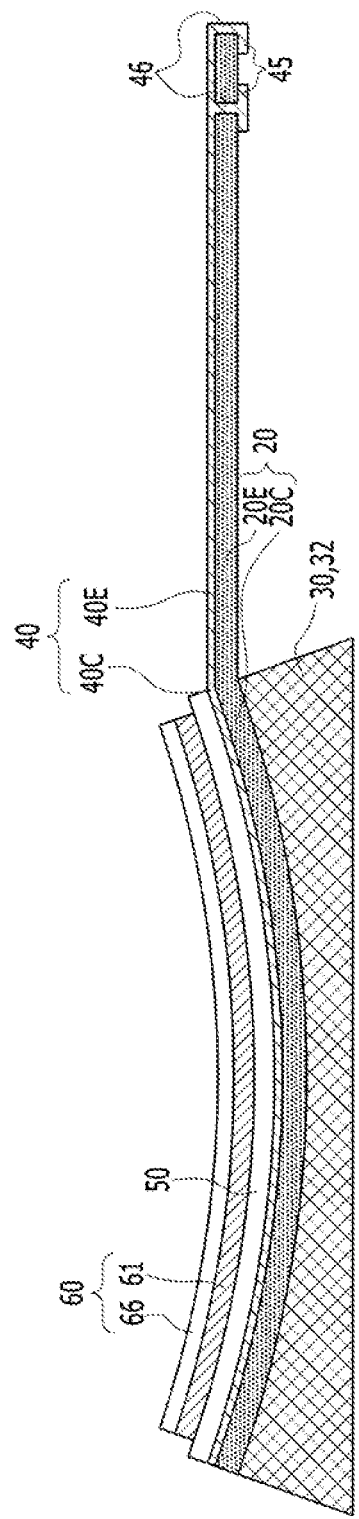

Referring to FIG. 2E, the image sensor 10E in accordance with an exemplary embodiment of the inventive concepts includes the circuit board 20, the supporting board 30, the board wiring layer 40, the adhesive layer 50, and the image sensor chip 60. The supporting board 30 may include a supporting plate 32 having a relatively thin central area and a relatively thick peripheral area and supporting members 34 of bump shapes beneath the supporting plate 32.

In exemplary embodiments of the inventive concepts, the side surfaces of the circuit board 20, the supporting board 30, the board wiring layer 40, the adhesive layer 50, and the image sensor chip 60 of the image sensors 10A-10E may be vertically aligned.

The image sensors 10A-10E in accordance with embodiments of the inventive concepts have concaved surfaces so that the spherical aberration of a lens, the focal error of a lens, and a difference in the amount of received light between the center and the periphery can be corrected.

FIGS. 3A to 3E are sectional views of image sensor modules 100A-100E in accordance with exemplary embodiments of the inventive concepts, respectively. Referring to FIGS. 3A to 3E, each of the image sensor modules 100A-100E in accordance with exemplary embodiments of the inventive concepts may include a circuit board 20, a supporting board 30 beneath the circuit board 20, a board wiring layer 40 on the circuit board 20, an adhesive layer 50 on the board wiring layer 40, and an image sensor chip 60 on the adhesive layer 50. For example, each of the image sensor modules 100A-100E may include at least one of the image sensors 10A-10E described with reference in FIG. 2A to 2E.

Compared to FIGS. 2A to 2E, the circuit board 20 and board wiring layer 40 of each of the image sensor modules 100A-100E in accordance with exemplary embodiments of the inventive concepts may include concavely curved central areas 20C and 40C and extension areas 20E and 40E, respectively. The extension areas 20E and 40E may provide an electrical connection with an external system.

More specifically, the extension area 40E of the board wiring layer 40 may include a plurality of metal lines. The board wiring layer 40 may further include external connectors 45 and board via plugs 46. The external connectors 45 may have pad shapes when viewed from the top and may be disposed on the bottom surface of the circuit board 20. The external connectors 45 may deliver an electrical signal, received from the image sensor chip 60 through the board wiring layer 40 to an external controller or processor. That is, the external connectors 45 may include a conductive material, such as metal. The board via plugs 46 may surround or pass through the circuit board 46 or may electrically couple the external connectors 45 and the extension area 40E of the board wiring layer 40. The external connectors 45 and the board via plugs 46 may include conductors, such as copper (Cu).

The image sensor module 100B may further include a chip connector 71, 72 to electrically connect the image sensor chip 60 to the board wiring layer 40. The chip connector 71, 72 may include at least one of a bonding wire 71 or a chip via plug 72. Both the bonding wire 71 and the chip via plug 72 are illustrated in FIGS. 3A to 3E, but one of the bonding wire 71 and the chip via plug 72 may be selectively provided.

Figure 4A:
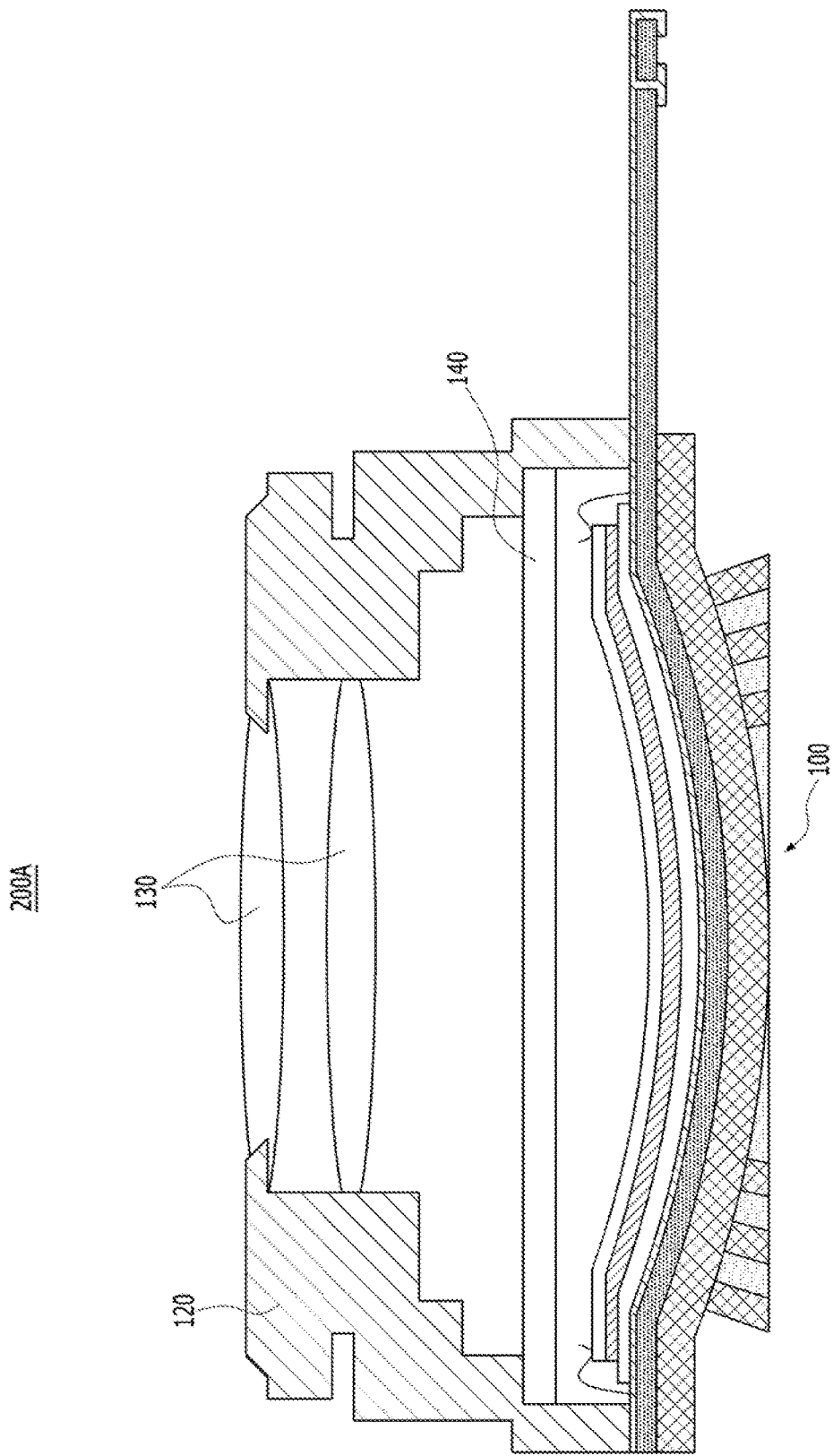
FIGS. 4A and 4B are sectional views illustrating camera modules in accordance with various embodiments of the inventive concepts.
Figure 4B:
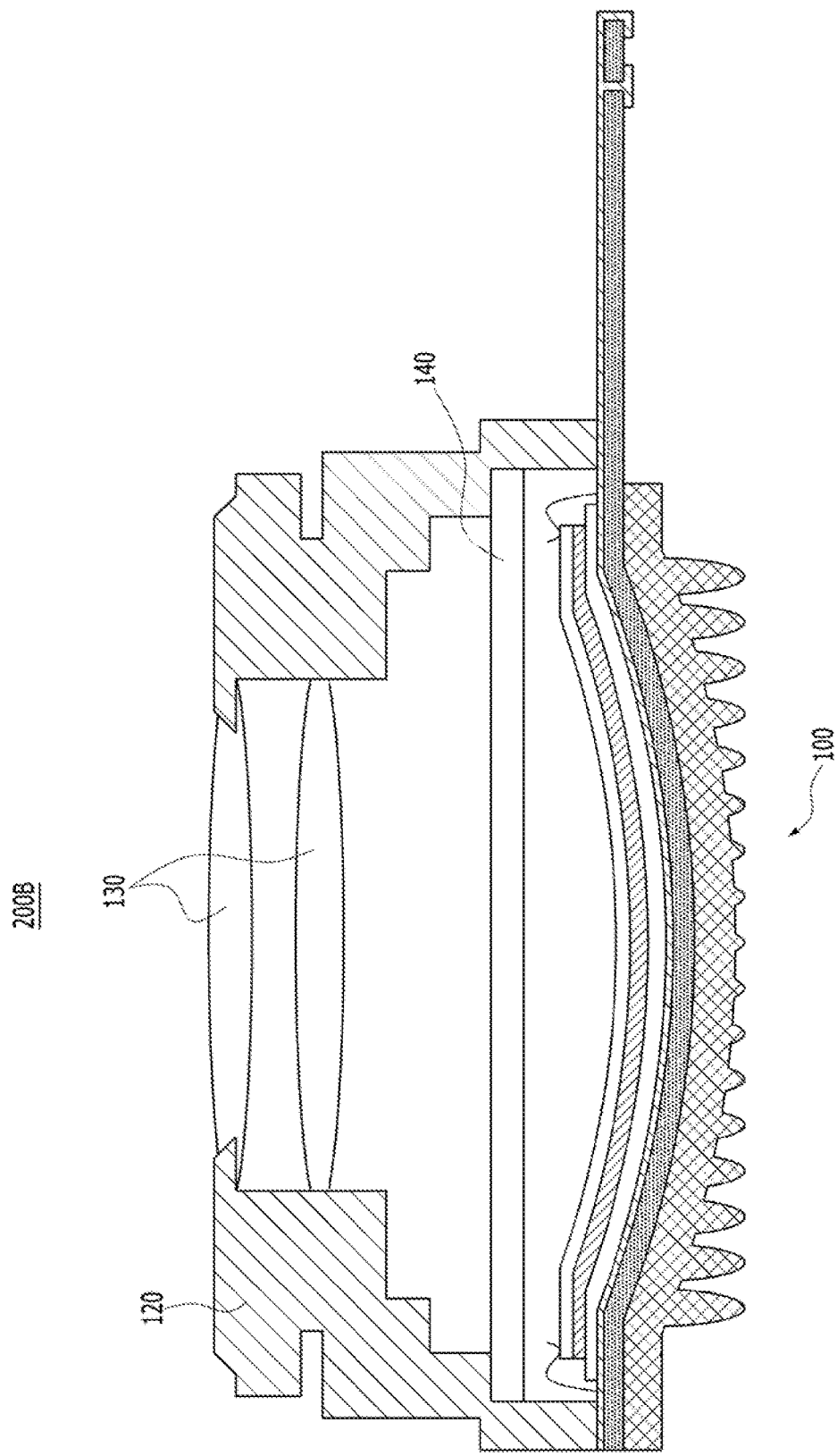

FIGS. 4A and 4B are schematic longitudinal sectional views of camera modules 200A and 200B in accordance with exemplary embodiments of the inventive concepts.

Referring to FIGS. 4A and 4B, each of the camera modules 200A and 200B in accordance with exemplary embodiments of the inventive concepts may include at least one of the image sensors 10A-10E shown in FIGS. 2A to 2E or at least one of the image sensor modules 100A-100E shown in FIGS. 3A to 3E, and may further include a camera housing 120, a camera lens 130, and an infrared (IR) filter 140.

FIGS. 5a and 5B, 6A and 6B, and 7A and 7B are diagrams illustrating methods of fabricating the image sensors or the image sensor modules in accordance with exemplary embodiments of the inventive concepts.

Figure 5A:
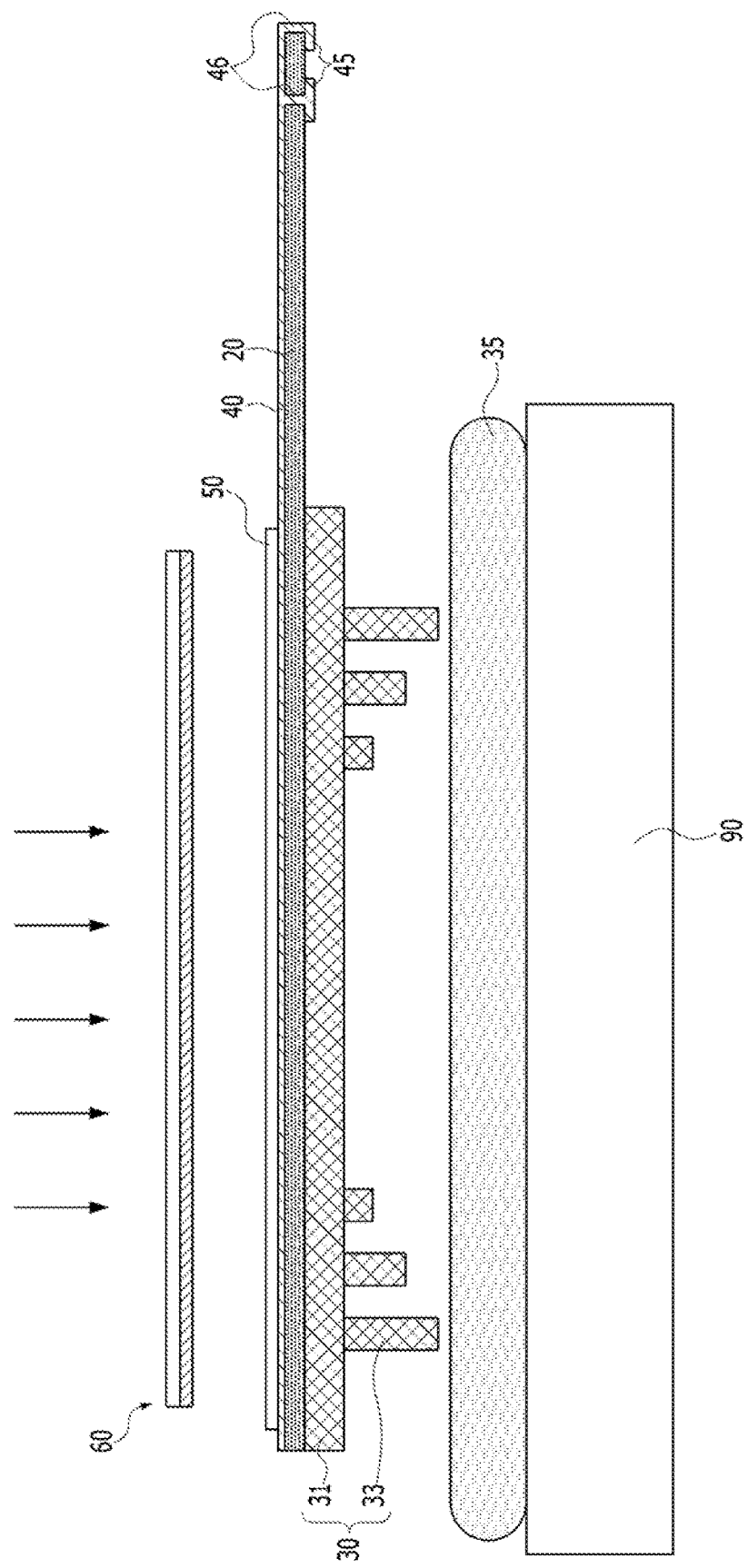

Referring to FIG. 5A, a method of fabricating an image sensor in accordance with an exemplary embodiment of the inventive concepts may include mounting an image sensor chip 60 on a flat circuit board 20, a supporting board 30, a board wiring layer 40, and an adhesive layer 50 and compressing them on a fixing member 35. The fixing member 35 is in a paste state and provided on a table 90. The supporting board 30 may include a supporting plate 31 and supporting members 33. The supporting plate 31 may be substantially flat. As the supporting members 33 become closer to the central area of the supporting plate 31, the lengths of the supporting members 33 may become relatively shorter, the widths of the supporting members 33 may become relatively narrower, or the volumes of the supporting members 33 may become relatively smaller. Furthermore, as the supporting members 33 become closer to the peripheral area of the supporting plate 31, the lengths of the supporting members 33 may become relatively longer, the widths of the supporting members 33 may become relatively wider, or the volumes of the supporting members 33 may become relatively greater.

Figure 5B:
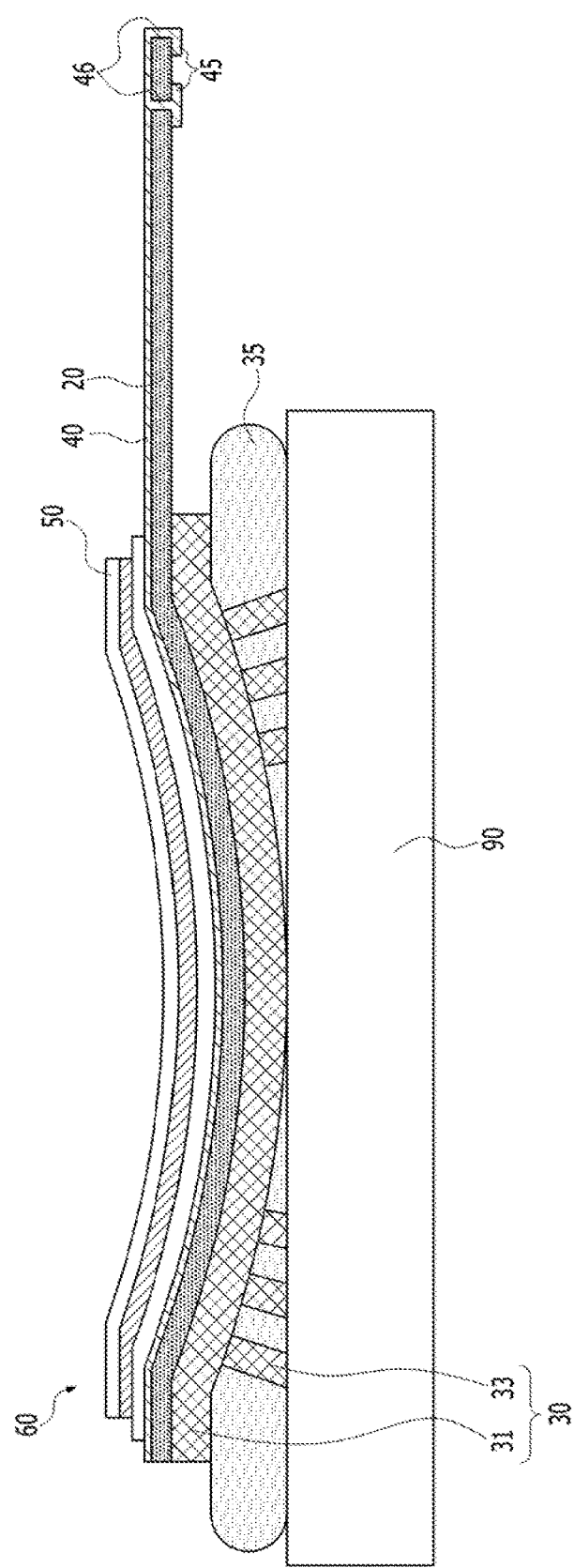

Referring to FIG. 5B, the method may include hardening the adhesive layer 50 and the fixing member 35 by heating them. The circuit board 20, the supporting board 30, the board wiring layer 40, the adhesive layer 50, and the image sensor chip 60 may have concavely curved upper surfaces.

Referring to FIG. 6A, a method of fabricating an image sensor in accordance with an exemplary embodiment of the inventive concepts may include mounting an image sensor chip 60 on a flat circuit board 20, a supporting board 30, a board wiring layer 40, and an adhesive layer 50 and compressing them against a fixing member 35 of a paste state provided on a table 90. The supporting board 30 may include a supporting plate 31 and supporting members 34. The supporting plate 31 may be substantially flat, or a central area of a bottom surface of the supporting plate 31 may be concave. The supporting members 34 may have bump shapes and protrude downward from the bottom surface of the supporting plate 31. Accordingly, a bottom part of the supporting board 30 may have a concave-convex shape or an embossing shape.

Figure 6B:
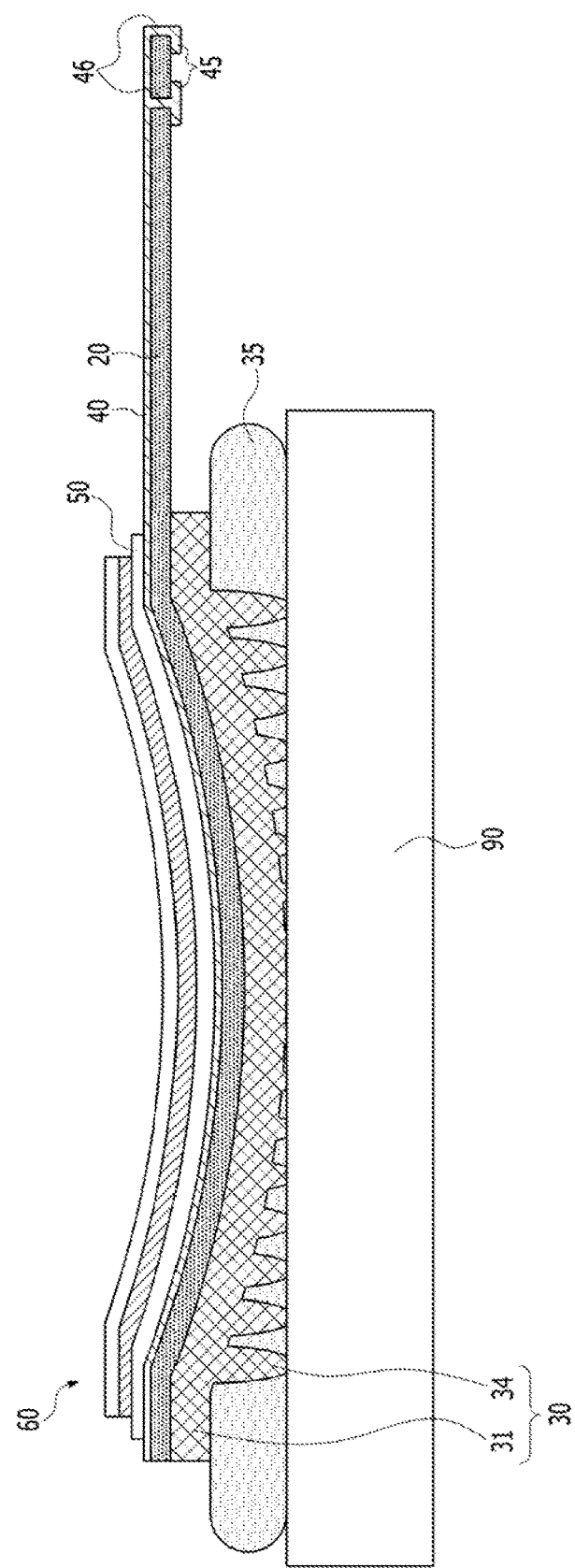

Referring to FIG. 6B, the method may include hardening the adhesive layer 50 and the fixing member 35 by heating them.

Referring to FIG. 7A, a method of fabricating an image sensor in accordance with an exemplary embodiment of the inventive concepts may include mounting an image sensor chip 60 on a flat circuit board 20, a supporting board 32, a board wiring layer 40, and an adhesive layer 50 and compressing them on a table 90. A central area of a bottom surface of the supporting board 32 may be concave. The supporting board 32 may include thermosetting resin.

Figure 7B:
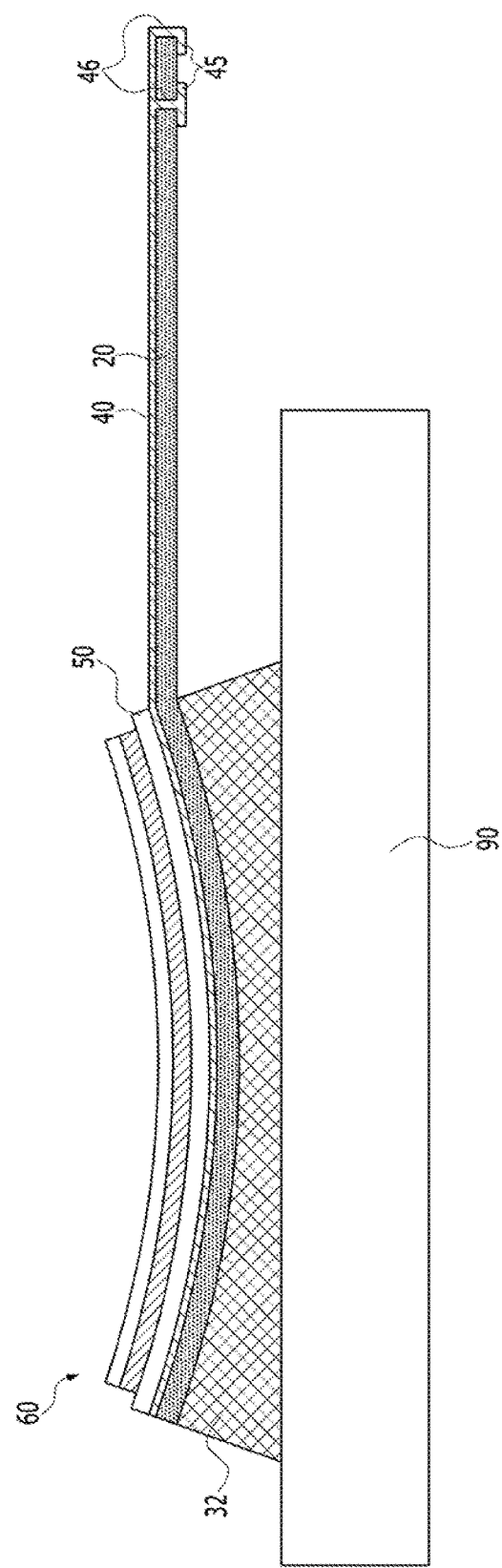

Referring to FIG. 7*b*, the method may include hardening the supporting board 32 by heating it. A bottom surface of the supporting board 32 may be substantially flat.

Figure 8:
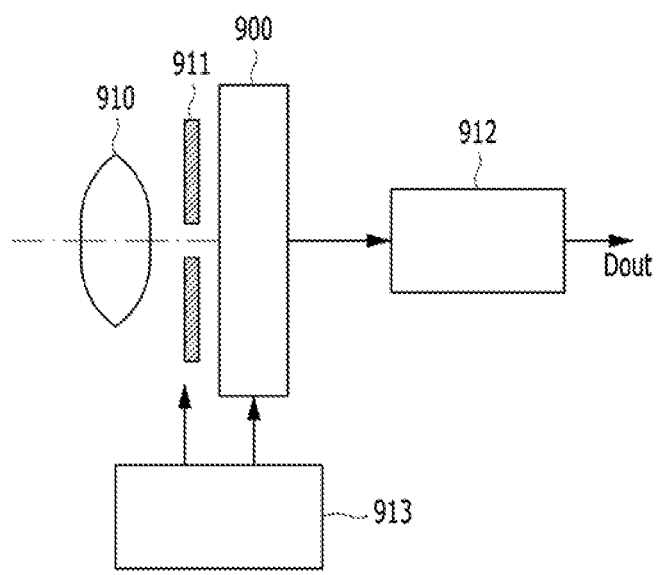
FIG. 8 is a diagram illustrating an electronic device including an image sensor or an image sensor module in accordance with an embodiment of the inventive concepts.

FIG. 8 is a diagram schematically illustrating an electronic device including at least one of the image sensors 10A-10E or the image sensor modules 100A-100E in accordance with exemplary embodiments of the inventive concepts. Referring to FIG. 8, an electronic device including at least one of the image sensors 10A-10E or the image sensor modules 100A-100E in accordance with various exemplary embodiments of the inventive concepts may include a camera capable of capturing a still image or a moving image. The electronic device may include an optical system or an optical lens 910, a shutter unit 911, an image sensor 900, and a driving unit 913 and signal processing unit 912 configured to control/drive the shutter unit 911.

The optical system 910 guides image light or incident light from a subject, which is taken by an optical device such as a camera, to the pixel array (refer to 2 of FIG. 1) of the image sensor 900. The optical system 910 may include a plurality of optical lenses. The shutter unit 911 controls a light radiation and shield period for the image sensor 900. The driving unit 913 controls the transmission operation of the image sensor 900 and the shutter operation of the shutter unit 911. The signal processing unit 912 performs a variety of types of signal processing on a signal output by the image sensor 900. An image signal Dout generated by the signal processing may be stored in a storage medium, such as memory, or may be displayed on a monitor.

The image sensors and the image sensor modules in accordance with the inventive concepts can obtain an image without distortion since an aberration is corrected by the curved upper surfaces.

In accordance with the methods for forming the image sensors and the image sensor modules according to the inventive concepts, the image sensors having the curved upper surfaces and the image sensor modules including the image sensors can be formed by employing the plate having the concaved center, the plate having the concave-convex portion, or the board having the supporting members.

Although various exemplary embodiments have been described for illustrative purposes, it will be apparent to those skilled in the art that various changes and modifications may be made without departing from the spirit and scope of the invention as defined in the following claims.

What is claimed is:

1. An image sensor, comprising:
a circuit board;
a supporting board provided under the circuit board;
an image sensor chip provided over the circuit board;
a board wiring layer and an adhesive layer which are provided between the circuit board and the image sensor chip; and
a chip connector electrically connecting the circuit board to the board wiring layer together,
wherein the circuit board, the supporting board, and the image sensor chip respectively have concavely curved upper surfaces,
wherein the supporting board comprises a central area and a peripheral area, and
wherein the central area is thinner than the peripheral area.

2. The image sensor of claim 1,
wherein the circuit board comprises a flexible printed circuit board.

3. The image sensor of claim 1,
wherein the supporting board comprises a thermosetting material.

4. The image sensor of claim 1,
wherein the supporting board comprises:
a supporting plate having the concavely curved upper surface; and
a plurality of supporting members provided under the supporting plate.

5. The image sensor of claim 4,
wherein each of the plurality of supporting members has a bump shape downwardly protruding from a bottom surface of the supporting plate.

6. The image sensor of claim 5,
wherein the plurality of supporting members includes first supporting members located in the central area and second supporting members located in the peripheral area, and
wherein the first supporting members are smaller in size than the second supporting members.

7. The image sensor of claim 4,
wherein the supporting plate and the plurality of supporting members are formed of the same material.

8. The image sensor of claim 4,
wherein the plurality of supporting members are spaced apart from each other, and
wherein the image sensor further comprises a fixing material which is provided under the supporting plate and between the plurality of supporting members.

9. The image sensor of claim 8,
wherein the fixing material comprises a thermosetting material.

10. An image sensor, comprising:
a circuit board;
a supporting board provided under the circuit board;
a board wiring layer provided over the circuit board; and
an image sensor chip provided over the board wiring layer,
wherein the supporting board comprises a supporting plate and a plurality of supporting members,
wherein the supporting plate has a concavely curved upper surface,
wherein the plurality of supporting members is provided under the supporting plate, and
wherein the supporting plate and the plurality of supporting members are formed of the same material.

11. The image sensor of claim 10,
wherein each of the plurality of supporting members has a pillar shape.

12. The image sensor of claim 11,
wherein the plurality of supporting members includes first supporting members and second supporting members,
wherein the first supporting members are located under a central area of the supporting plate,
wherein the second supporting members are located under a peripheral area of the supporting plate, and
wherein the first supporting members are shorter in length than the second supporting members.

13. The image sensor of claim 10,
wherein the plurality of supporting members are not disposed under a central area of the supporting plate and are disposed under a peripheral area of the supporting plate.

14. The Image sensor of claim 10,
wherein bottom surfaces of the plurality of supporting members are arranged horizontally flat.

15. The image sensor of claim 10,
wherein the circuit board, the supporting plate, and the board wiring layer comprise first, second, and third central areas and first, second, and third peripheral areas, respectively,
wherein upper surfaces of the first, the second, and the third central areas are concavely curved, and wherein upper surfaces of the first, the second, and the third peripheral areas are flat.

16. The image sensor of claim 15,
wherein the image sensor chip comprises a pixel array and circuit array,
wherein the pixel array is provided over the third center area of the circuit board,
wherein the circuit array is provided over the third peripheral area of the circuit board, and
wherein the first, the second, and the third central areas of the circuit board, the supporting plate of the supporting board, and the board wiring layer vertically overlap the pixel array of the image sensor chip.

17. An image sensor, comprising:
a flexible circuit board;
a rigid supporting board provided under the flexible circuit board;
a board wiring layer provided over the flexible circuit board; and
an image sensor chip provided over the board wiring layer,
wherein the circuit board, the supporting board, the board wiring layer, and the image sensor chip comprise first areas and second areas, respectively,
wherein each of the second areas is located in a periphery of each of the first areas,
wherein each of the first areas has a concavely curved upper surface,
wherein each of the second areas has a flat upper surface, and
wherein the first area of the supporting board has a concave-convex bottom surface.

18. The image sensor of claim 17,
wherein the supporting board comprises:
a supporting plate comprising a third area and a fourth area, and
supporting members provided under the third area of the supporting plate, wherein an upper surface of the supporting plate in the third area forms the concavely curved upper surface of the supporting board, and wherein the supporting members in the fourth area, in combination, form the concave-convex bottom surface of the supporting board.

19. The image sensor of claim 18, wherein the supporting members are spaced apart from each other, and wherein the image sensor further comprises a fixing member which is disposed under the third area of the supporting plate and between the supporting members.

* * * * *